(12) United States Patent
Ziegler (10) Patent No.: US 7,151,408 B2
(45) Date of Patent: Dec. 19, 2006

(54) METHOD FOR GENERATING A RADIO-FREQUENCY ALTERNATING VOLTAGE AND AN ASSOCIATED RADIO-FREQUENCY POWER AMPLIFIER

(75) Inventor: Joachim Ziegler, Schwanau (DE)

(73) Assignee: Huettinger Elektronik GmbH + Co. KG, Freiburg (DE)

(*) Notice: Subject to any disclaimer, the term of this patent is extended or adjusted under 35 U.S.C. 154(b) by 0 days.

(21) Appl. No.: 11/124,391

(22) Filed: May 9, 2005

(65) Prior Publication Data

US 2005/0264355 A1 Dec. 1, 2005

Related U.S. Application Data

(63) Continuation of application No. PCT/EP03/12176, filed on Oct. 31, 2003.

(51) Int. Cl.
H03F 3/217 (2006.01)
(52) U.S. Cl. .................. 330/251; 330/207 A
(58) Field of Classification Search ............ 330/207 A, 330/251, 302
See application file for complete search history.

(56) References Cited

U.S. PATENT DOCUMENTS

| 3,860,881 A | 1/1975 | Etherington et al. ........ 330/302 |
| 3,946,326 A | 3/1976 | Minner et al. .............. 330/291 |
| 4,673,886 A | 6/1987 | Bickley et al. ............. 330/298 |
| 4,717,884 A | 1/1988 | Mitzlaff ...................... 330/251 |
| 5,276,912 A | 1/1994 | Siwiak et al. ................. 455/73 |
| 5,396,194 A * | 3/1995 | Williamson et al. ........ 330/297 |
| 5,747,935 A | 5/1998 | Porter et al. ............ 315/111.51 |

OTHER PUBLICATIONS

"PM 2105 Data Sheet," Pacific Monolithics, Richardson Electronics, Ltd., May 31, 2000, pp. 1-4.

* cited by examiner

Primary Examiner—Steven J. Mottola
(74) Attorney, Agent, or Firm—Fish & Richardson P.C.

(57) ABSTRACT

A radio-frequency power amplifier system operated in a resonant mode of operation includes a uniform power source, a switching element adapted for applying power on and off at a basic frequency from the uniform power source to a resonant circuit connected to a varying-resistance load at an output of the resonant circuit, a plurality of interconnected electrical components, including reactive elements, that together form, in their interconnected state during a particular operating state of the amplifier, one or more parasitic oscillating circuits having undesired resonance frequencies lower than the basic frequency, and one or more attenuating members adapted for attenuating oscillations in the parasitic oscillating circuits to prevent oscillations in the parasitic oscillating circuits from arising and to suppress low-frequency modulations of the basic frequency.

30 Claims, 8 Drawing Sheets

METHOD FOR GENERATING A RADIO-FREQUENCY ALTERNATING VOLTAGE AND AN ASSOCIATED RADIO-FREQUENCY POWER AMPLIFIER

CROSS-REFERENCE TO RELATED APPLICATIONS

This application is a continuation application of and claims priority to PCT Application Serial No. PCT/EP2003/012176, filed on Oct. 31, 2003, the entire contents of which are hereby incorporated by reference. The PCT application claims Convention priority from German Application Serial No. DE 102 52 146.8, filed on Nov. 9, 2002, the entire disclosure of which is also incorporated herein by reference.

TECHNICAL FIELD

This disclosure relates radio frequency amplifiers and, more particularly, to a method for generating a radio-frequency alternating voltage and an associated radio-frequency power amplifier.

BACKGROUND

Radio-frequency power amplifiers used in resonant operation may be amplifiers of the classes D, E, F, or comparable amplifiers and can include switched current supplies that are operated in a resonant operation. These switched current supplies or radio-frequency power amplifiers used in resonant operation are referred to simply as "amplifiers" herein.

Alternating voltage energy can be used in plasma processes, gas discharge processes for thin film coating or etching, or for laser excitation (i.e., with loads that can have strongly-varying load resistance). The use of the above-mentioned amplifiers for such applications is generally known.

The basic principle of such an amplifier is to use at least one switching element that is switched on and off with a basic frequency to guide power in a clocked manner from a uniform power source via a circuit to a resonant circuit to the output of which the load is connected. Ideally, this resonant circuit ensures that only the basic frequency is passed on to the load and that the switching element(s) can be operated with minimum loss. The output power is controlled by the power supply at the uniform power source (e.g., a DC voltage source). A circuit between the power source and the switching element ensures that the current cannot change during one period of the basic frequency. One or more MOSFETs are frequently used for the switching element.

There are different designs of amplifiers of this type, which can be known as amplifiers of classes D, E, and F. Some amplifiers are adjusted to different applications or also slightly modified. An amplifier of this type ideally has no lossy components and is operated with high efficiency. Real amplifiers show small losses in the resonant circuit and mainly in the switch of the circuit. Amplifiers operating at output powers of up to some 10 kW still can achieve an efficiency of 90% and more.

Generally, a precondition for proper functioning of such amplifiers is that the load to which the amplifier is connected has a finite load resistance. The associated load may be a simple load, and can be a plasma (e.g., used in plasma processing) or a laser excitation path, but may also be a combination of such a load and an upstream matching network or a transfer line or a combination of both or even further parts.

The load resistance in a gas discharge process or in a similar processes is very high when the gas discharge has not been ignited, and the amplifier, therefore, is operated practically in an open circuit condition. Furthermore, such processes can generate arcs that represent a very low-ohmic load resistance (e.g., similar to a short-circuit). Moreover, such processes must cover a very large power range, often from only a few 10 W up to several 10 kW.

Experiments have shown that in many cases during such processes there is no constant alternating voltage at the basic frequency in the unloaded state or during a short-circuit of an amplifier, but rather that the basic frequency (e.g., 10–100 MHz, or, more particularly, 13 MHz) is applied at the output with a superposed low-frequency amplitude modulation. For example, the frequency of the low-frequency signal of a 3 kW amplifier operated without a load at the output of the amplifier can be between 200 kHz and 2 MHz and can have a voltage amplitude that is 100% of the ac output voltage amplitude of the basic frequency. A similar behavior can occur at low powers, for example for a 80 W amplifier at the output and correct terminal impedance. This behavior is undesired in such applications.

It is therefore desirable to reduce undesired subfrequencies at extreme operating states of the amplifier (i.e., during open- or short-circuited operation of the amplifier) and any intermediate operating state of the amplifier, and at different output powers from the amplifier. The efficiency of the amplifier should thereby not be reduced and the expense for stabilization measures should be comparatively small.

SUMMARY

In one general aspect a method of generating a radio-frequency alternating voltage with an amplifier operating in a resonant mode includes switching on and off at least one switching element of the amplifier at a basic frequency to supply power from a uniform power source into a resonant circuit connected to a variable-resistance load, where the circuit includes several interconnected components, including reactive elements, which form, in their interconnected state during certain operating states of the amplifier, one or more parasitic oscillating circuits having undesired resonance frequencies other than the basic frequency. One or more of the parasitic oscillating circuits that develop in different operating states of the amplifier that differ from a normal operating state of the amplifier are identified. The parasitic oscillating circuits have resonance frequencies lower than the basic frequency, and the different operating states are due to at least one of a load resistance that differs from a normal load resistance, a supply voltage that differs from a normal supply voltage, or an output power that differs from a normal output power. Oscillations of the identified one or more parasitic oscillating circuits are prevented from arising.

Implementations include one or more of the following features. For example, the oscillations can be prevented from arising by modifying the identified one or more parasitic oscillating circuits. The oscillations can be prevented from arising by attenuating the one or more identified parasitic oscillating circuits. The uniform power source can be operated as a current source or as a voltage source with an internal resistance that is sufficiently high to achieve an approximately constant current output. The one or more parasitic oscillating circuits can be attenuated to have a quality factor of slightly less than 1. The one or more parasitic oscillating circuits can be attenuated by at least one ohmic resistance. The one or more parasitic oscillating circuit can be attenuated by a circuit that includes at least one non-linear element that extracts energy from the one or more parasitic oscillating circuits and reintroduces this energy at another location of the resonant circuit.

In another general aspect, a radio-frequency power amplifier system operated in a resonant mode of operation includes a uniform power source, a switching element adapted for applying power on and off at a basic frequency from the uniform power source to a resonant circuit connected to a varying-resistance load at an output of the resonant circuit, a plurality of interconnected electrical components, including reactive elements, that together form, in their interconnected state during a particular operating state of the amplifier, one or more parasitic oscillating circuits having undesired resonance frequencies lower than the basic frequency, and one or more attenuating members adapted for attenuating oscillations in the parasitic oscillating circuits to prevent oscillations in the parasitic oscillating circuits from arising and to suppress low-frequency modulations of the basic frequency.

Implementations include one or more of the following features. For example, the load can include a plasma or a laser excitation path. The system can include a matching network between the amplifier and the load. The particular operating state can be a state in which a supply voltage of the power source is different than a normal supply voltage of the power source. The particular operating state can be a state in which an output power of the amplifier is different than a normal output power of the amplifier.

The power source can be a uniformly controllable power source, and the system can further include a first circuit connected to the uniform power source, where the first circuit includes largely loss-free reactive elements adapted to ensure that power supplied to other parts of the amplifier remains constant over a basic frequency period, a network connected to the first circuit, where the network includes non-dissipative reactive elements and being adapted for connection to the load, and a second circuit connected to the network, where the second circuit includes a switching element that is switched at the basic frequency that comprises largely non-dissipative reactive elements. The first circuit can include a choke, the second circuit can include a switch operated at the basic frequency and a capacitor connected in parallel with the switch, the network can include a resonant circuit tuned to the basic frequency and an inductance for performing a phase shift between current and voltage, and the power source can include a controllable voltage source.

The first circuit can include a choke, the second circuit can include a switch operated at the basic frequency and a capacitor connected in parallel with the switch, and a first inductance connected in series for performing a phase shift between current and voltage, where the network includes a second inductance connected in series with the first inductance and a first capacitance connected in parallel with the switch, the first inductance, and the second inductance, and where a first node point between the first capacitance and the second inductance is connected to the load. The system can further include a second capacitance connected between the first node point and the load.

The first circuit can include a choke, the second circuit can include a switch operated at the basic frequency cycle and a capacitor connected in parallel with the switch and a first inductance connected in series for performing a phase shift between current and voltage, and the network can include a first matching member having a second inductance connected in series with the first inductance and a first capacitance connected in parallel with the switch, the first inductance, and the second inductance. The system can further include a second matching network connected at the first node point between the capacitance and the second inductance, where the second matching network includes a third inductance connected in series and a third capacitance connected in parallel to the first capacitance and the third inductance, and where the load is connected at a second node point of the third inductance and the third capacitance. The second capacitance can be connected between the first node point and the second matching network.

The power source can include a controllable voltage source and where the voltage source can be switched to the first node point through the choke. The power source can include a controllable voltage source and the voltage source can be switched to the first node point through a band-eliminating filter that is tuned to the basic frequency. The power source can be a current source.

At least one of the parasitic oscillating circuits can include interconnected reactive elements within the first circuit, the second circuit and the network, where a resonance frequency of the at least one of the parasitic oscillating circuits is lower than the basic frequency.

The first capacitance can include a first partial capacitance and a second partial capacitance in series with each other and further including a resistance connected to ground in parallel with the two partial capacitances and an inductance connected between the second partial capacitance and ground, where the series circuit of the second partial capacitance and the inductance is tuned to the basic frequency. The third inductance can include a first partial inductance and a second partial inductance in series with each other, and can further include a resistance connected between the two partial inductances at one end and to the first node point at the other end, where the second capacitance and the first partial inductance form a series circuit tuned to the basic frequency.

The switch can further include at least one MOSFET, which comprises a parasitic reverse diode having a voltage-dependent capacitance and a parasitic transistor, which reaches its conducting state during rapid voltage changes.

The details of one or more implementations are set forth in the accompanying drawings and the description below. Other features will be apparent from the description and drawings, and from the claims.

DESCRIPTION OF DRAWINGS

FIG. 1b is a symbolic illustration of an implementation of the amplifier of FIG. 1a.

DETAILED DESCRIPTION

The invention is based in part on the principle of attenuating one or more parasitic oscillating circuits that develop at different operating states of a switched amplifier (where the different states can have different loads, different supply voltages, and/or different output powers) where the parasitic circuits have resonance frequencies of a lower frequency than the basic frequency of the amplifier and where the attenuation prevents oscillations from arising in the parasitic circuits.

Undesired oscillations can be generated if a parasitic oscillating circuit for this undesired oscillation has a quality factor greater than one is present and the circuit is excited. It has turned out that complex attempts to eliminate excitation of such oscillating circuits are not required if these parasitic oscillating circuits are detected and their quality factors are adjusted and reduced to prevent oscillations from arising in them, without thereby reducing the efficiency of the amplifier.

Thus, the attenuating members do not need to absorb existing or generated energy, neither at the desired basic frequency nor at undesired frequencies, but rather these members can keep the quality factor below one for parasitic oscillating circuits having relatively low resonance frequencies compared with the basic frequency, thereby preventing these parasitic oscillating circuits from generating disturbing modulations at the output even under excitation.

The switching element of the switched amplifier need not always be kept in a stable state but can be operated irregularly due to a missing terminal impedance or low voltage and is, for example, not closed any more for individual periods. Thus, possible subfrequencies and the low-frequency modulations produced therefrom can be eliminated from the amplifier output. Tests have shown that operation of the switch need not be absolutely stable, and it is still possible to generate a continuous alternating voltage signal without undesired modulations at the output. As used herein, elimination of undesired oscillations means that the generation of the undesired oscillations is prevented in the preliminary stages and not that they are absorbed in additional elements.

The amplifier can be operated as a current source or as a voltage source with an internal resistance that is sufficiently high for an approximately constant current for attenuating one or more parasitic oscillating circuits which form in different operating states with respectively different load and/or different supply voltage and/or different output power. This also attenuates undesired oscillating circuits and therefore produces a modulation-free output signal.

As described herein, determining the correct location and correct dimensioning of the attenuating members ensures that the basic frequency is not attenuated, no new parasitic oscillating circuits are generated, and construction of the device is facilitated. It can be advantageous to attenuate a parasitic oscillating circuit in aperiodic borderline cases.

Figure 1A:
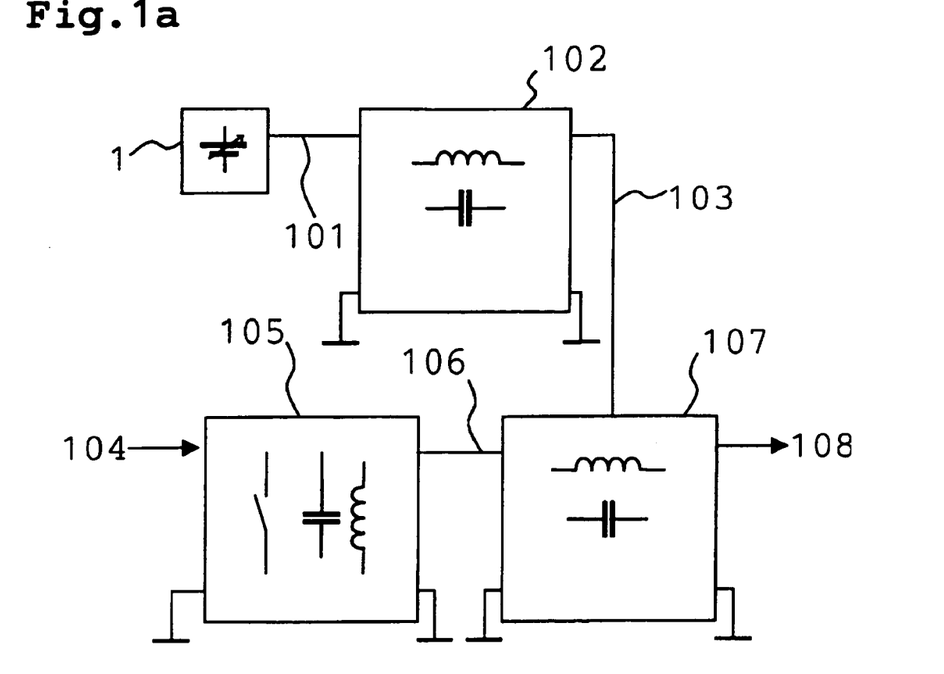
FIG. 1a is a schematic circuit diagram of an amplifier operated in a resonant operation.

FIG. 1a shows the basic construction of an amplifier, which is operated in a resonant mode, in the form of interconnected multipoles. The quadrupole 105 contains the switching element or the switching elements along with parasitic or directly-connected reactive elements. These are schematically indicated in the form of a switch, an inductance, and a capacitance and may be present in different ways, individually or collectively, and can be interconnected, depending on the mode of operation and components selected, e.g., for the switch. The switching elements are switched on and off by a signal 104 according to the cycle of the basic frequency of the switching amplifier. The quadrupole 105 is coupled, via a connection 106, to the network 107, which includes reactive elements that are ideally loss-free. The reactive elements are also schematically indicated in the form of an inductance and capacitance, which may also be present in different manners, individually or collectively, and be interconnected, depending on the desired mode of operation. One or more transmitters (not shown) may be provided in this network or in the quadrupole 105. The load may also be connected to the connection 108 of the network 107. The network ensures that initially and ideally only the basic frequency is passed on to the load and secondly that the switching elements can be operated in the quadrupole 104 with minimum loss. The reactive elements in the quadrupole 104 and in the network 105 are thereby not linearly independent of each other and in total influence the properties of the amplifier. The power is supplied via the line 103 to the network 107. The power supply is supplied from a uniform power source 1 that is generally a controllable direct voltage source. Power from the power source 1 is supplied to a quadrupole 102 via line 101, and the quadrupole 102 adopts the task of keeping the power supply constant over the basic frequency period, which is achieved in most cases by a choke, as described below, but can also be achieved in a different manner through one or more reactive elements that are interconnected depending on the desired mode of operation. The reactive elements are also schematically indicated in the form of an inductance and capacitance. The output power is controlled by the power supply at the constant power source 1. The line 103 to the network 107 is applied at the output of the quadrupole 102. The reactive elements of the network 107 and of the quadrupole 102 are also connected and influence, together with the quadrupole 104, the properties of the amplifier. The connections 106 may be one single line but may also consist of several lines if, e.g., several switching elements in the quadrupole 104 are interconnected only in the network 107. The connections 101 and 102 are not limited to single lines either. As described and shown herein, correlations of elements in switched current supplies that include reactive elements can be represented in a general form and with a clarity that allows identification of parasitic oscillating circuits with the correlated elements.

In general, depending on the design of the reactive elements in the quadrupoles 102, 104 and network 107, parasitic oscillating circuits are present or can be present through the connections 103 and 106. During normal operation, these oscillating circuits are generally sufficiently attenuated by the real load at the connection 8 and are also generally not excited. If this load is not present (e.g., if the output 8 is unloaded or short-circuited) or if the effect of the load is insufficient to attenuate the oscillations, oscillations of these oscillating circuits may be stimulated, but stimulation of the oscillation circuit is necessary for oscillations to arise or build up in the circuit. As mentioned above, we assume that the excitation of these oscillating circuits cannot be prevented or can be prevented only with great difficulty, and that it is more advantageous to attenuate these parasitic oscillating circuits such that oscillations do not arise in them, rather than trying to prevent the excitation of the oscillations in the first place.

Figure 1B:
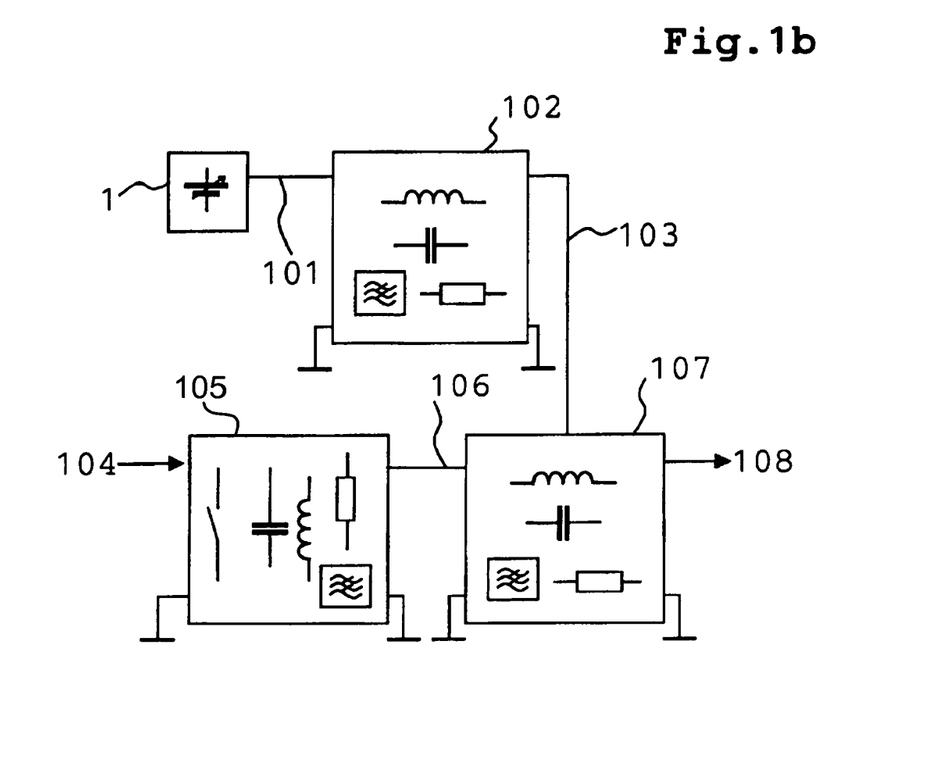

As shown in FIG. 1*b*, a resistance and a low-pass filter can also be included in the quadrupole 102, which indicate the attenuation of oscillating circuits at subfrequencies in the quadrupole 102. A similar resistance and low-pass filters can be included in the quadrupoles 107 and 105 and symbolize the attenuation of oscillating circuits at subfrequencies in the network 107 and 105, respectively. Attenuation may be achieved at one or more of the above-mentioned locations. Attenuation may be achieved using resistances, dissipative reactive elements, non-linear components or circuits which extract energy from the amplifier to introduce it again e.g., at another location. One example thereof is shown in FIG. 11 and explained herein. It is thereby important that the attenuating members are used and dimensioned such that the basic frequency is not attenuated, which is explained in more detail with reference to FIGS. 3*c*, 7, 8, 9 and 10. At first, however, excitation of such oscillations is explained with reference to FIG. 2.

Figure 2:
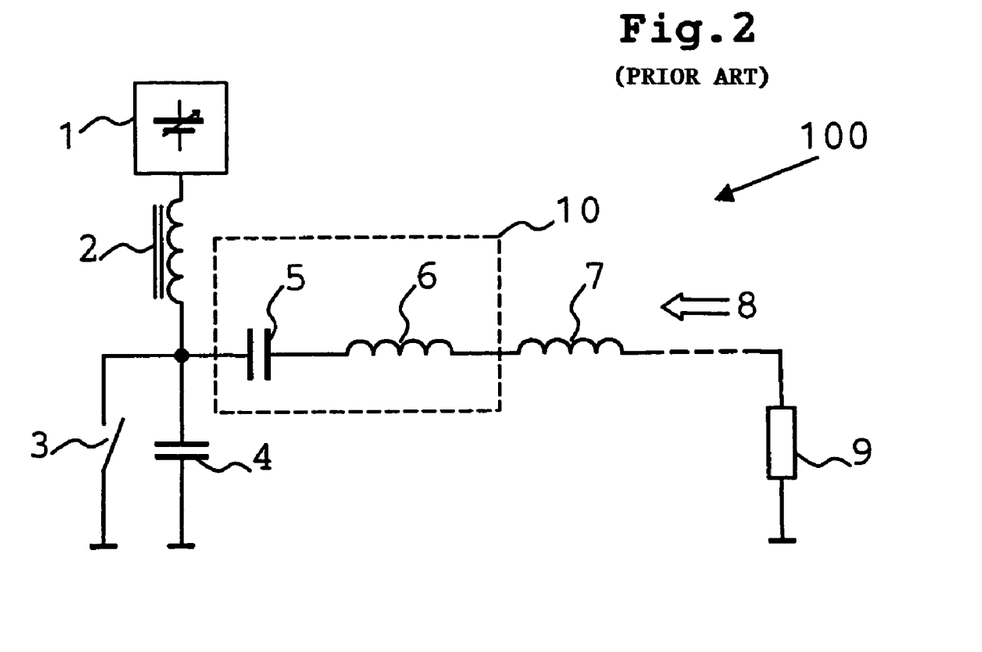
FIG. 2 is a schematic circuit diagram of a typical class E amplifier.

FIG. 2 shows the basic structure of a typical class E amplifier 100. Its function is explained below.

A switch 3 is switched on and off according to the cycle of the basic frequency. A resonant circuit 10 that includes a series capacitor 5 and a series inductance 6 is tuned to the basic frequency and ensures that only current of the basic frequency can flow to a load resistance 9. A choke 2 ensures that the current from a voltage source 1 remains constant for a basic frequency period. A capacitor 4 connected in parallel to the switch 3 serves as an energy storage and as an curve shaper. An inductance 7 adjusts the phase shift between current and voltage such that the switch 3 is switched on at the time at which the voltage over it is optimally zero and the voltage change is minimal. Compared to FIG. 1*a*, the switch 3 with capacitance 4 represents the quadrupole 105, the choke 2 represents the quadrupole 102, and the inductances 6 and 7 and the capacitance 5 represent the network 107. This circuit arrangement permits generation of high power at high frequencies and with minimum loss and attains an efficiency of approximately 90% or more. However, for correct operation of an amplifier of this type, the load resistance 9 should be approximately equal to the internal resistance 8 of the circuit.

Tests and simulations have shown that during certain operating states, e.g., during a short circuit or non-load condition at the output or also for smaller powers, i.e., smaller voltages of the supply voltage, the amplifier enters a state in which a signal is applied at the output, which represents the basic frequency that is amplitude-modulated with a lower frequency. Such a signal is highly undesired for many applications.

To explain this modulation, the switch 3 must be more thoroughly observed. The switch 3 may preferably be realized by a MOSFET, which contains a reverse diode from drain to source having a voltage-dependent capacitance. Moreover, a MOSFET of this type has a parasitic transistor that becomes conductive in case of very steep voltage changes. Simulations show that an ideal switch and otherwise equal conditions produce no such modulations.

If the output is short- or open-circuited, the phase of the current is shifted relative to the voltage in the amplifier. The reverse diode in the MOSFET switch 3 is thereby brought into the conducting region or the parasitic transistor in the MOSFET is turned on, which produces the following negative effects: a reverse diode that is operated in the conducting range collects a large number of charge carriers between source and drain of the MOSFET. These charge carriers are removed again if the reverse diode is operated in the reverse current direction. Removal of the charge carriers induces a significant current which cannot be neglected. Viewed from the outside, the MOSFET behaves like a switched-on switch although it is blocked via its gate. This again slowly changes the current from the voltage source 1 via the choke 2 from period to period. The choke 2 does ensure a constant current over one period, but the current may vary over several periods. This is desired to provide control of the output power of the amplifier through the power source which permits excitation of the above-described parasitic oscillating circuits. The switch is continuously operated at the basic frequency but the current through the choke oscillates in addition to the capacitance at a comparably slower, characteristic undesired frequency and modulates this frequency onto the basic frequency.

A modulation of this type may also be generated during operation at very small output powers caused by the parasitic capacitance in the switching element MOSFET, which depends highly on the voltage. The amplifier is dimensioned on the basis of the effective capacitance, i.e., the capacitance over one period. Since the capacitance is higher at small voltages than at high voltages, the effective capacitance at high voltage peaks is smaller than at small voltage peaks at the MOSFET. Since the capacitance change is non-linear, this effect increases more and more with small voltages. To obtain low output powers, the voltage at the switch 3 is reduced, resulting in a comparably high effective capacitance. In typical components for these switches, the effective capacitance increases from approximately 120 pF at voltage peaks of approximately 400 V to only 800 pF at voltage peaks of approximately 80 V but only to approximately 5 nF at voltage peaks of approximately 20 V. Thus, an important component in the amplifier changes its value by a multiple mainly at very small powers, which considerably mistunes the amplifier and consequently shifts the phase. This shift causes the reverse diode to become conducting, which permits excitation of a slow modulation oscillation in the same manner as explained above in the short- or open-circuited state.

If there is no load at the output, the load resistance 9 is infinitely large. The choke 2 and capacitance 4 then can form an undesired oscillating circuit that is excited by the slowly varying current in the choke. The switch 3 continues to switch at the basic frequency but the current through the choke 2 additionally oscillates with the capacitance 4 at a comparatively slower, natural, undesired subfrequency, modulating the signal at the basic frequency.

To suppress such modulation, this subfrequency oscillating circuit can be attenuated until the quality factor becomes smaller than 1 to thereby prevent oscillation of the oscillating circuit. This may be achieved, e.g., by increasing the internal resistance of the voltage source 1, i.e., replacing the voltage source by a current source. Simulations and also practical tests show in fact that an arrangement with a current source has a modulation-free output signal. If the voltage source is replaced by a current source, the choke 2 may be omitted.

In addition to, or instead of, this action, there are further possibilities of attenuating oscillating circuits which have further additional advantages. Modulations due to mismatching can be suppressed without major changes with relatively simple, clear modifications on existing amplifiers as described in more detail below.

Figure 3A:
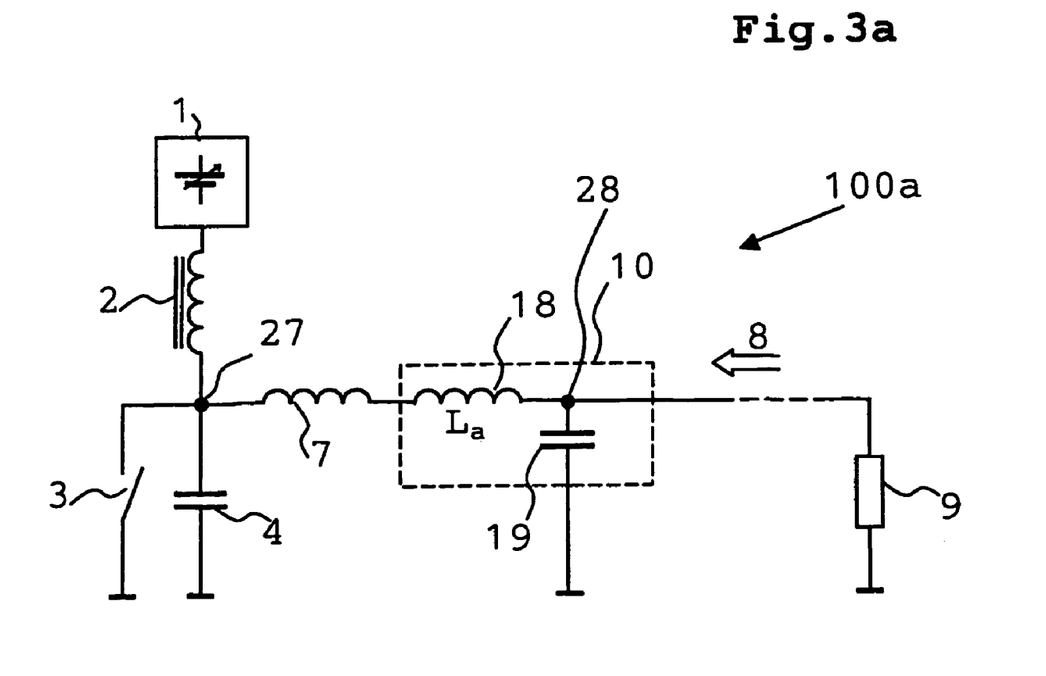
FIG. 3a is a circuit diagram of a modified class E amplifier with an attenuated parallel oscillating circuit.

FIG. 3*a* shows the basic structure of a modified class E amplifier 100*a*. The current supply via voltage source 1, the choke coil 2, the switching element 3 and the capacitance 4 correspond to the arrangement of FIG. 2. The inductance 7 adjusts the correct phase position of the current thereby providing that the conditions for switching the switch 3 on and off are met.

In this circuit, the resonant circuit 10 is designed as an attenuated parallel oscillating circuit that is tuned to the basic frequency and, with a sufficient quality factor, provides that the current at the basic frequency is preferably transmitted through the inductance 18. This meets a condition of the class E amplifier, namely sinusoidal current at the basic wave frequency through this inductance 18.

The resistance is subsequently transformed, in that an upward transformation from a relatively small internal resistance of the driving circuit to a larger load resistance 9 is performed.

In the circuit of FIG. 3*a*, the current supply may optionally not be connected to the end of the node 27 on the side of the switch, but to the load-side end of the combination consisting of inductance 7 for phase shift and the inductance, which belongs to the resonant circuit at node 28.

Since the inductances 7 and 18 are pure reactive elements, and the current supply in the range of the basic frequency provides a constant current (direct current), this action has no negative effect on the function of the circuit. One advantage of this action is that several switches with one capacitance each can be connected to the node 28 via one inductance each as a substitute for switch 3 and capacitance 4 and inductance 7. Another advantage of shifting the feed node is that the choke coil 2 can be replaced by a band-eliminating filter (e.g., a notch filter) for the basic frequency, since the choke need no longer be effective for frequencies above the basic frequency at node 28, since there are no harmonic oscillations any more at this location. The description of FIGS. 4*a* and 4*b* provides more details.

Figure 3B:
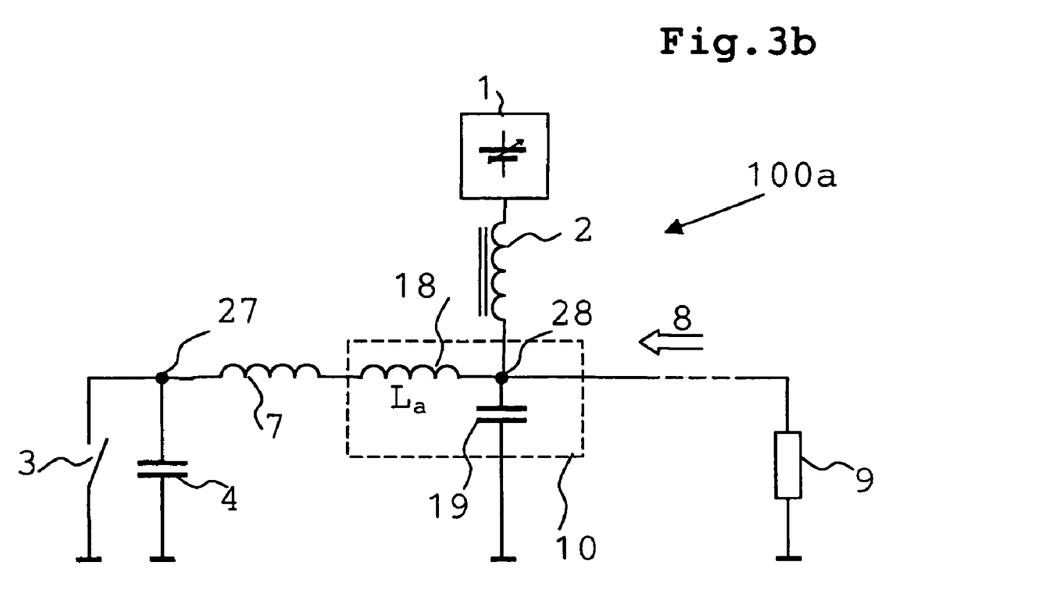
FIG. 3b is a circuit diagram of the amplifier of FIG. 3 with a displaced power supply.

In the open circuit state of FIG. 3*b*, the choke 2 and capacitance 19 may represent an oscillating circuit for subfrequencies, which is not attenuated and will oscillate upon excitation. Undesired modulations can also be prevented in this circuit by increasing the internal resistance of the voltage source or through direct attenuation of the parasitic oscillating circuit.

Figure 3C:
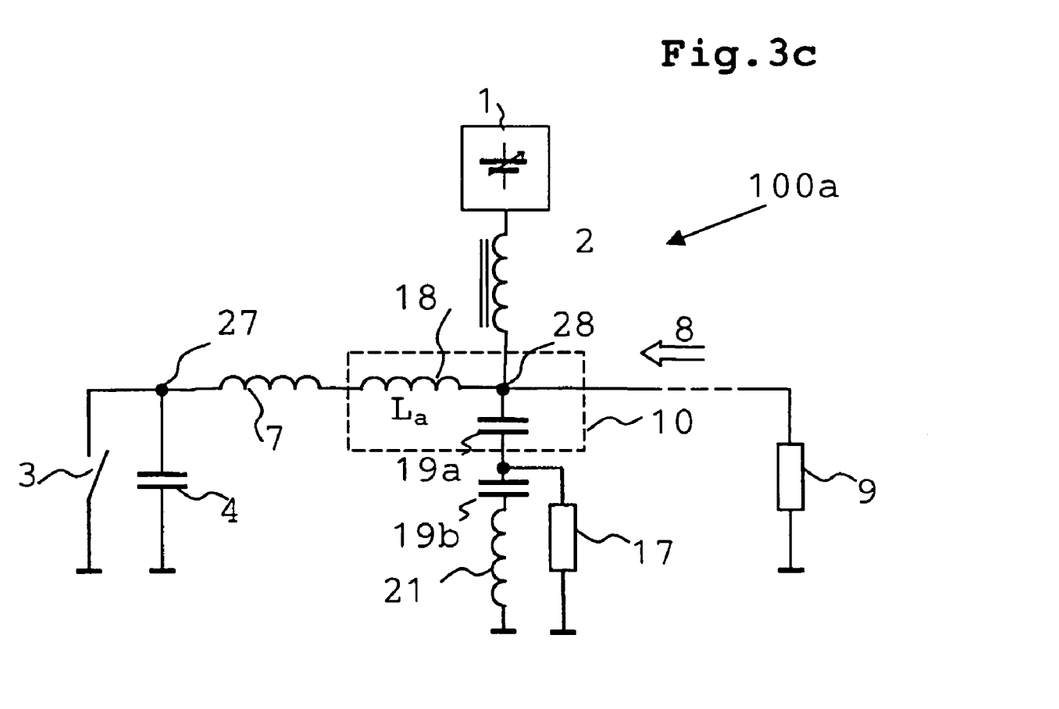
FIG. 3c is a circuit diagram of the amplifier of FIG. 3b with attenuation members for attenuating oscillating circuits having subfrequencies lower than the basic frequency of the amplifier.

FIG. 3*c* shows an example of such attenuation for this circuit. The capacitance 19 of FIG. 3*b* is thereby divided into two capacitances 19*a* and 19*b*, and an inductance 21 is connected in series with these capacitances. The series circuit of capacitance 19*b* and inductance 21 is tuned to the basic frequency. An attenuating member, shown as a resistance 17 in FIG. 3*c*, is connected in parallel to this series circuit. This attenuating member is ineffective for the basic frequency since the series circuit of capacitance 19*b* and inductance 21 permits unhindered passage of the basic wave. But the parasitic oscillating circuit which consists of choke 2 and capacitance 19 is sufficiently attenuated when the resistance is suitably selected to prevent it from oscillating.

Figure 4A:
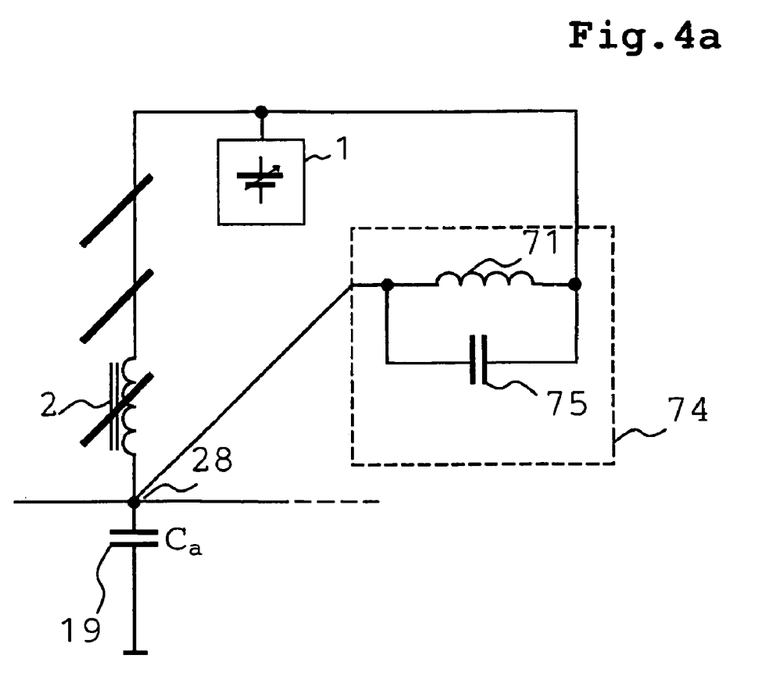
FIGS. 4a and 4b are schematic circuit diagrams of a power supply having a voltage source and a band-eliminating filter.
Figure 4B:
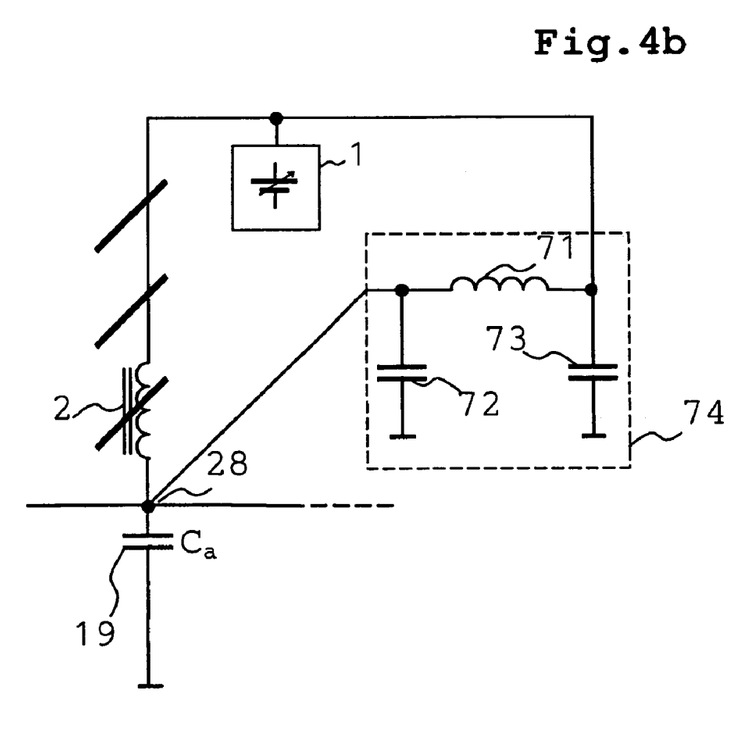

FIGS. 4*a* and 4*b* show two possible implementations of the above-mentioned band-eliminating filters that may be used alternatively with the radio-frequency choke 2. This band-eliminating filter 74 is connected to the node 28 between the inductance 18 and the capacitance 19 of the resonant circuit 10. The band-eliminating filter is tuned to the basic wave. The value of the inductance 71 can be considerably reduced compared to the choke 2 and the inductance can be designed without iron, i.e., without a ferrite core.

The band-eliminating filter 74 shown in FIG. 4*a* is formed from a parallel oscillating circuit that includes capacitance 75 and inductance 71. The band-eliminating filter 74 in FIG. 4*b* also includes a parallel oscillating circuit having an inductance 71 and two capacitors 72 and 73. The design of the parallel oscillating circuit having two capacitors 72 and 73 switched to ground can be advantageous, since radio-frequency disturbances are thereby also filtered.

Figure 5:
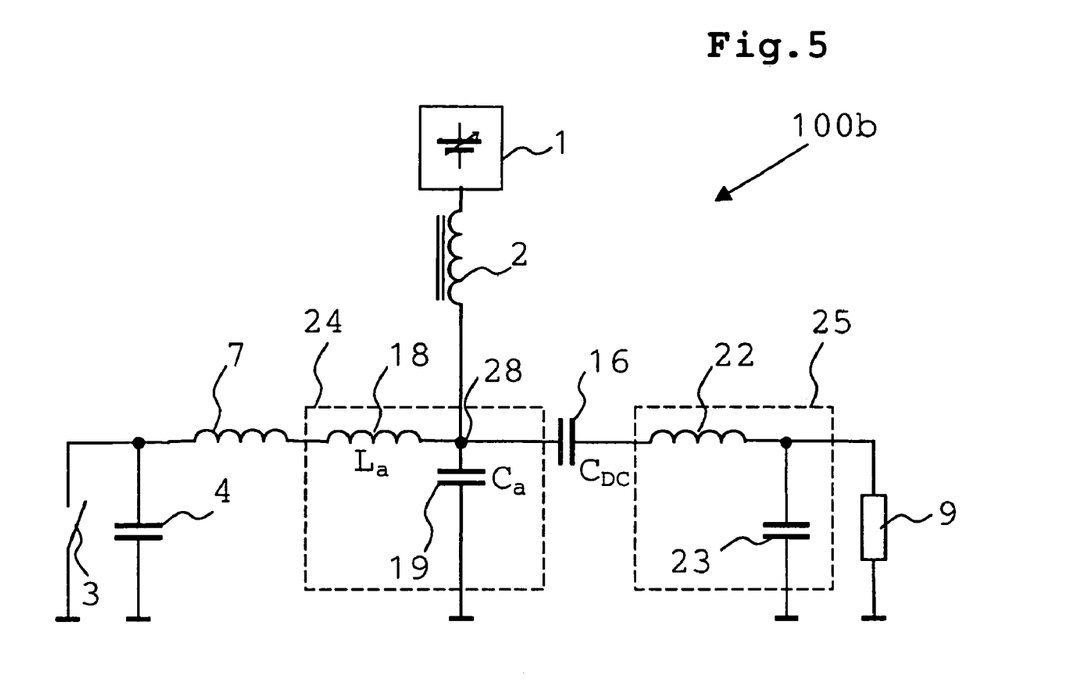
FIG. 5 is a schematic circuit diagram of a modified class E amplifier having two matching members.

FIG. 5 shows a switched modified class E power amplifier 100*b*. The power amplifier has a parallel resonant circuit that is similar to the resonant circuit 10 of FIG. 3*a* and thereby forms at the same time a first matching member 24. It realizes resistance matching in two stages, in that the first matching member 24 is joined by a second matching member 25 via a capacitor 16 that serves to decouple direct current. In this arrangement, the voltage source is displaced together with the choke 2 to the node 28 within the matching member 24. A band-eliminating filter 74 as shown in FIG. 4 can be used instead of the choke 2.

The first matching member 24 and the parallel filter contain the following components: inductance 18 and capacitance 19. The first matching member 24 is tuned to the basic frequency.

The second matching member 25 contains an inductance 22 and a capacitance 23. The load resistance 9 is connected to the second matching member 25.

Figure 6:
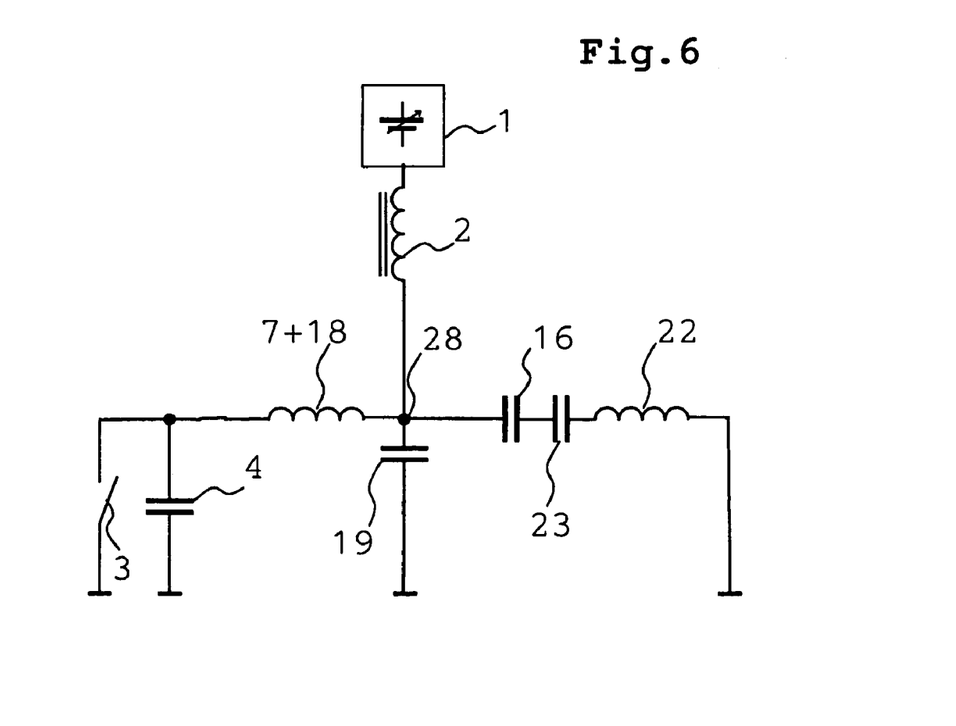
FIG. 6 is a schematic circuit diagram of the circuit of FIG. 5 reduced to the components that are effective in an unloaded condition.

In case of mismatching with practically infinite load resistance, i.e., in an unloaded state, the circuit can be reduced to the elements shown in FIG. 6.

For low frequencies, the series circuit of capacitance 4 and inductances 7 and 18 has a capacitive effect. The same applies for the circuit with coupling capacitor 16, capacitance 23 and inductance 22. If the circuit is further reduced to the components that are essential for low frequencies, a parasitic oscillating circuit including choke 2 and capacitances 4, 19, 16, and 23 is obtained, wherein the values for the effective capacitances must be further increased by the series inductances, and this oscillating circuit can be attenuated to prevent oscillations from arising in the parasitic circuit. As mentioned above, this may be achieved by attenuation in the voltage source, however, other designs are also possible.

Figure 7:
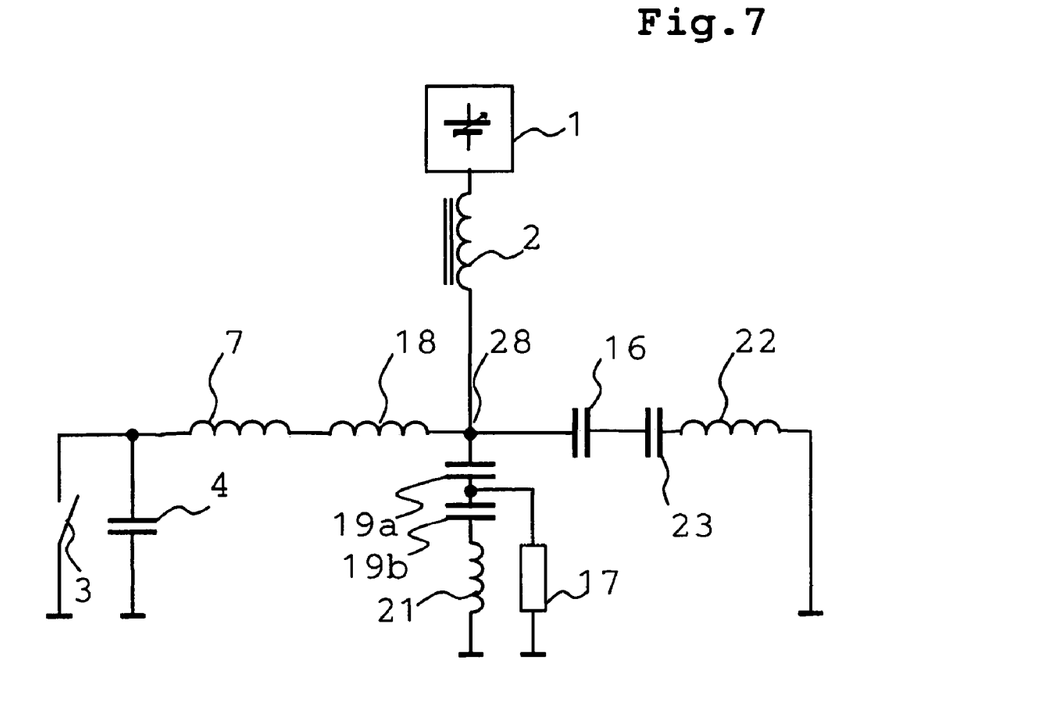
FIG. 7 is a schematic circuit diagram of an amplifier in accordance with FIG. 5, however, having attenuation measures for attenuating a parasitic oscillating circuit in the open circuit condition.

Attenuation of this oscillating circuit can be obtained in the following manner and as described with reference to FIG. 7. As shown in FIG. 7, the capacitance 19 is divided into two capacitances 19*a* and 19*b*, such that a serial circuit having a capacitance 19*b* and an inductance 21 is tuned to the basic frequency. This series circuit forms a low-ohmic path for the basic frequency. This series circuit of capacitance 19*b* and inductance 21 is, however, high-ohmic for the undesired subfrequencies.

The undesired oscillating circuit formed from choke 2 with capacitance 19*a* is connected to a resistance 17 as an attenuating member and is thereby attenuated to such a large extent that the quality factor is slightly below 1. The resistance must be accordingly designed. If the attenuation is too high, the attenuation of the parasitic oscillating circuit is very good but other oscillating circuits will form such as, e.g., with the capacitor 4 or the capacitances 16 and 23.

Figure 8:
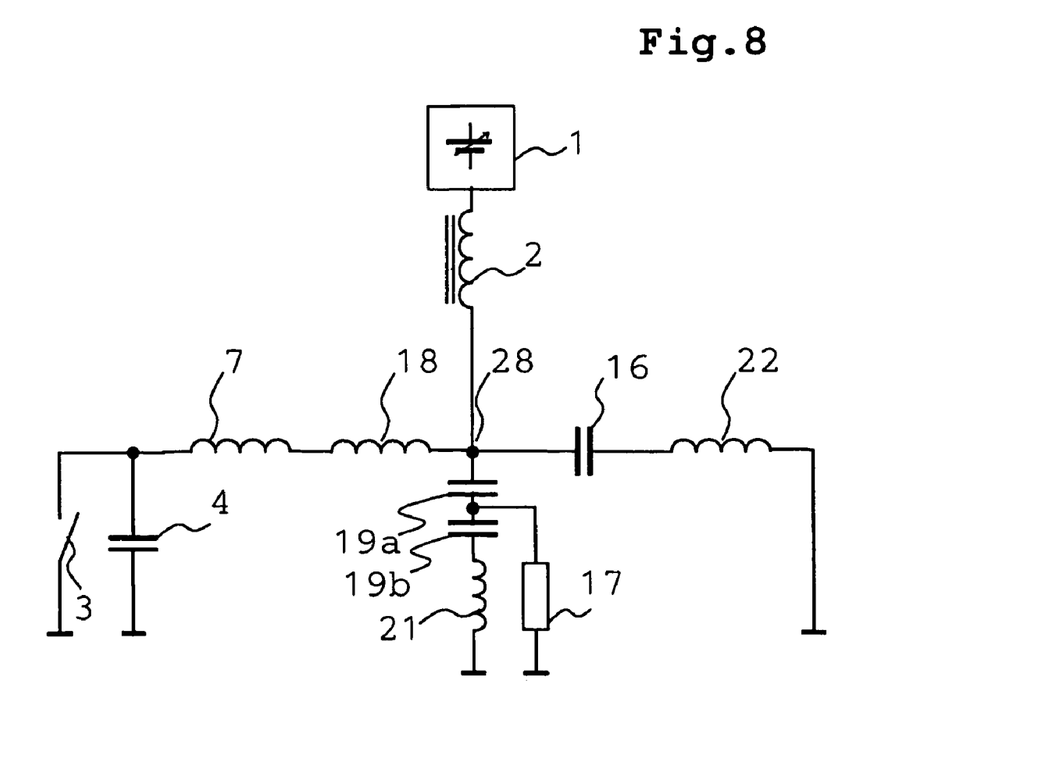
FIG. 8 is a schematic circuit diagram of the circuit of FIG. 5 reduced to the components that are effective in case of a short-circuit.

FIG. 8 shows an operating state based on FIG. 7 in which the output is short-circuited, and the load resistance 9 is practically zero Ohms. The capacitance 23 (as shown in FIG. 5) is thereby short-circuited and an undesired oscillating circuit for modulation frequencies may form in the branch of the choke 2, the capacitor 16, and the inductance 22.

Figure 9:
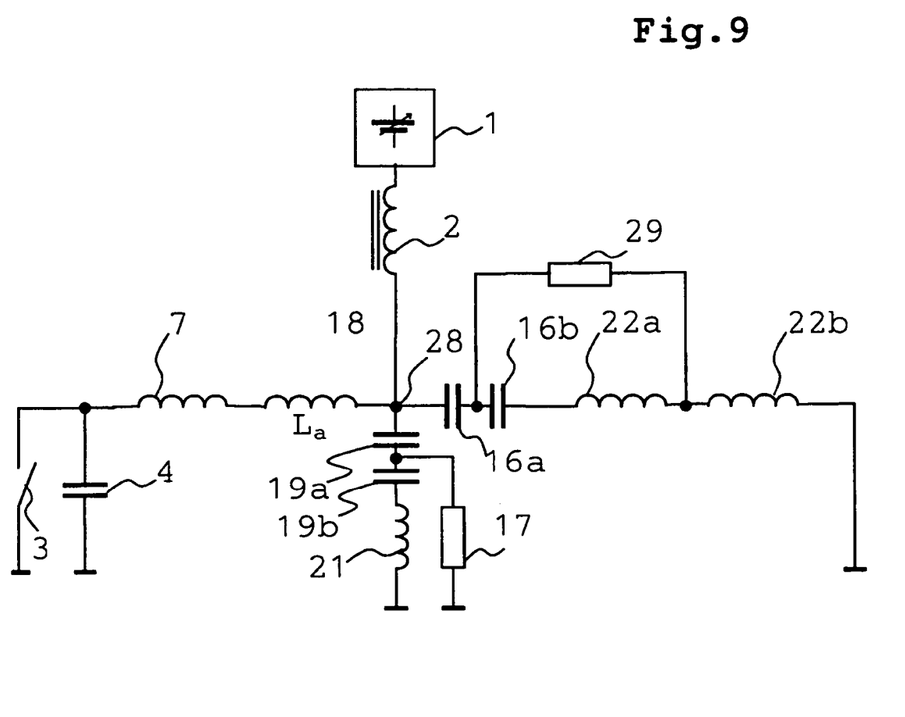
FIG. 9 is a schematic circuit diagram of an amplifier corresponding to the circuit diagram of FIG. 5, however, having attenuation members for attenuating a parasitic oscillating circuit in case of a short-circuit.

As shown in FIG. 9, a circuit can prevent undesired modulations when the circuit is short-circuited and can attenuate the parasitic oscillating circuit. Towards this end, the inductance 22 that belongs to the second matching member 25 is divided into two partial inductances 22a and 22b. In addition, the capacitance 16 is divided into two capacitances 16a and 16b for direct voltage division. A resistance 29 is connected to the connection between the two partial inductances as an attenuating member whose other end is connected to the connection between the two partial capacitances 16a and 16b.

The inductance 22 can be divided into two partial inductances 22a and 22b through tapping the inductance 22, wherein the attenuation resistance is applied to the tapping point. The tapping point is selected such that the capacitance 16b and the inductance 22a represent a series circuit for the basic frequency which can pass the resistance 29 without being hindered. The resistances 29 and 17 are selected only as example for attenuating arrangements, and may be replaced at any time by other attenuating arrangements.

Figure 10:
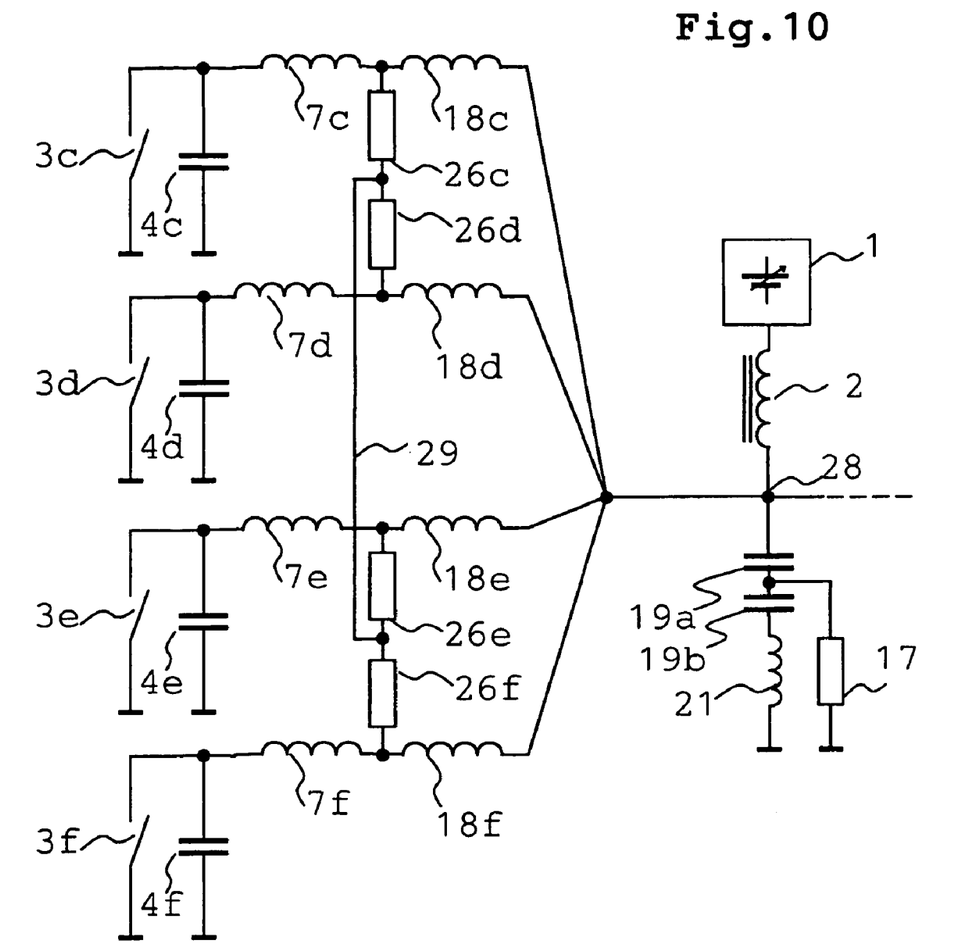
FIG. 10 is a schematic circuit diagram of part of a circuit of an amplifier in accordance with FIG. 9 having several power switches that are connected in parallel.
Figure 11:
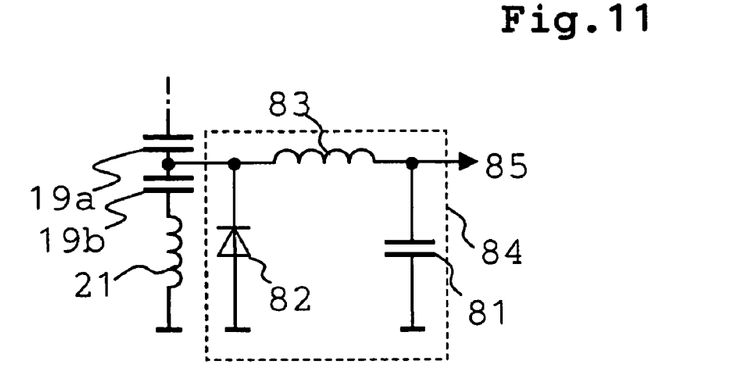
FIG. 11 is a schematic circuit diagram of a circuit for attenuation of oscillating circuits using non-linear components and extraction of energy.

As shown in FIG. 10, instead of a switch 3 with capacitance 4, several switches with smaller capacitances each may be connected in parallel over a combination of inductances each. The parallel connection permits amplification of very large powers with considerably less expensive components for the switching elements. However, even with synchronously controlling driver stages, there are phase differences in the individual branches in practice due to the differences in the switches concerning switching speed, switching-on voltage at the gate and differences in the parasitic components. Connection between these switching elements with slightly different switching characteristics via the inductances is greatly advantageous in that the resistances 26c, 26d, 26e, and 26f can be introduced for phase correction of a inductance 7c, 7d, 7e, or 7f relative to a star point 29. FIG. 10 shows a general parallel connection of several branches of the components 3, 4, 7, and 18 using the components 3c, 3d, 3e, 3f, 4c, 4d, 4e, 4f, 7c, 7d, 7e, 7f, 18c, 18d, 18e, and 18f with reference to an example with four branches. They are connected at the node 28.

The choke in FIGS. 5 through 10 can be replaced in each case through a band-eliminating filter of FIG. 4.

FIG. 11 shows a section of FIGS. 3C or FIG. 7 through FIG. 10 with capacitances 19a, 19b, and inductance 21. The resistance 17 is replaced by a circuit 84 with non-linear components, in the present example by a diode 82 as rectifying element, a choke 83 for alternating voltage division and a capacitance 81 for smoothing. Parts of the basic frequency will also in this case not flow over the circuit 84, since the series circuit that includes capacitance 19b and inductance 21 permits unhindered passage of the basic frequency. To obtain an attenuating effect, energy is extracted from the circuit at connection 85 which can be supplied to a direct voltage source which permits additional improvement of the efficiency of the circuit.

All above-described actions which have only exemplary character for a plurality of possible designs, have the purpose to reduce the quality factor of parasitic oscillating circuits for low-frequency oscillations.

It is also possible to suppress generation of low-frequency oscillations with the currently available components and acceptable expense rather than trying to absorb existing oscillations at certain locations. Oscillations can be suppressed by detecting the corresponding oscillating circuits in the amplifier and reasonably reducing the quality factor of these oscillating circuits to ensure that these do not generate any oscillations at the same time preventing changes in the basic frequency properties in the circuit.

With an attenuated circuit of this type, it is no longer required that the switch be operated in such a manner that the parasitic diode or the parasitic transistor do not reach the conducting state. Low-frequency oscillations will no longer be generated since a rising of oscillation of the corresponding oscillating circuits is no longer possible. Real amplifiers that were tested in unloaded or short-circuited operation showed that with the above-described measures, no low-frequency modulations occurred at the output even during operation of the MOSFET in states in which it remains conductive for parts of periods or entire periods for the above-mentioned reasons. The above-described circuits represent only a few exemplary possibilities of attenuation of these undesired oscillating circuits, and it is important to realize other designs are also possible for attenuating the undesired oscillations. The described excitation of subfrequencies is moreover not limited to switched current supplies with MOSFETs. Oscillating circuits for subfrequencies can be excited in the many different ways and the methods and circuits describe herein are effective for any possible excitation, since they does not try to prevent this excitation but rather prevent the rising of oscillation of the oscillating circuits.

A number of implementations have been described. Nevertheless, it will be understood that various modifications may be made. Accordingly, other implementations are within the scope of the following claims.

What is claimed is:

1. A method of generating a radio-frequency alternating voltage with an amplifier operating in a resonant mode, the method comprising:

switching on and off at least one switching element of the amplifier at a basic frequency to supply power from a uniform power source into a resonant circuit connected to a variable-resistance load, wherein the resonant circuit comprises several interconnected components, including reactive elements, which form, in their interconnected state during certain operating states of the amplifier, one or more parasitic oscillating circuits within the amplifier having undesired resonance frequencies other than the basic frequency;

identifying one or more of the parasitic oscillating circuits having resonance frequencies lower than the basic frequency that develop in different operating states of the amplifier that differ from a normal operating state of the amplifier, wherein the different operating states are due to at least one of a load resistance that differs from a normal load resistance, a supply voltage that differs from a normal supply voltage, or an output power that differs from a normal output power; and preventing oscillations in the identified one or more parasitic oscillating circuits from arising by modifying the identified one or more parasitic oscillating circuits within the amplifier.

2. The method of claim 1, wherein oscillations are prevented from arising by attenuating the one or more identified parasitic oscillating circuits.

3. The method of claim 1, wherein the uniform power source is operated as a current source or as a voltage source with an internal resistance that is sufficiently high to achieve an approximately constant current output.

4. The method claim 2, wherein the one or more parasitic oscillating circuits are attenuated to have a quality factor of slightly less than 1.

5. The method of claim 2, wherein the one or more parasitic oscillating circuits are attenuated by at least one ohmic resistance.

6. The method of claim 2, wherein the one or more parasitic oscillating circuit are attenuated by a circuit that comprises at least one non-linear element that extracts energy from the one or more parasitic oscillating circuits and reintroduces this energy at another location of the resonant circuit.

7. A radio-frequency power amplifier system, wherein the amplifier is operated in a resonant mode of operation, the amplifier comprising:
a uniform power source;
a switching element adapted for applying power on and off at a basic frequency from the uniform power source to a resonant circuit connected to a varying-resistance load at an output of the resonant circuit;
a plurality of interconnected electrical components, including reactive elements, that together form, in their interconnected state during a particular operating state of the amplifier, one or more parasitic oscillating circuits within the amplifier and being identified as having undesired resonance frequencies lower than the basic frequency; and
one or more attenuating members adapted for attenuating oscillations in the parasitic oscillating circuits to prevent oscillations in the parasitic oscillating circuits from arising and to suppress low-frequency modulations of the basic frequency.

8. The system of claim 7, wherein the load comprises a plasma.

9. The system of claim 7, wherein the load comprises a laser excitation path.

10. The system of claim 7, further comprising a matching network between the amplifier and the load.

11. The system of claim 7, wherein the particular operating state is a state in which a supply voltage of the power source is different than a normal supply voltage of the power source.

12. The system of claim 7, wherein the particular operating state is a state in which an output power of the amplifier is different than a normal output power of the amplifier.

13. The system of claim 7, wherein the power source is a uniformly controllable power source, and further comprising: a first circuit connected to the uniform power source, the first circuit comprising largely loss-free reactive elements adapted to ensure that power supplied to other parts of the amplifier remains constant over a basic frequency period;
a network connected to the first circuit, the network comprising non-dissipative reactive elements and being adapted for connection to the load; and
a second circuit connected to the network, the second circuit comprising a switching element that is switched at the basic frequency that comprises largely non-dissipative reactive elements.

14. The system of claim 13, wherein the first circuit comprises a choke,
wherein the second circuit comprises a switch operated at the basic frequency and a capacitor connected in parallel with the switch,
wherein the network comprises a resonant circuit tuned to the basic frequency and an inductance for performing a phase shift between current and voltage, and
wherein the power source comprises a controllable voltage source.

15. The system of claim 13, wherein the first circuit comprises a choke,
wherein the second circuit comprises a switch operated at the basic frequency and a capacitor connected in parallel with the switch, and a first inductance connected in series for performing a phase shift between current and voltage,
wherein the network comprises a second inductance connected in series with the first inductance and a first capacitance connected in parallel with the switch, the first inductance, and the second inductance, and
wherein a first node point between the first capacitance and the second inductance is connected to the load.

16. The system of claim 15, further comprising a second capacitance connected between the first node point and the load.

17. The system of claim 13,
wherein the first circuit comprises a choke,
wherein the second circuit comprises a switch operated at the basic frequency cycle and a capacitor connected in parallel with the switch and a first inductance connected in series for performing a phase shift between current and voltage,
wherein the network comprises a first matching member having a second inductance connected in series with the first inductance and a first capacitance connected in parallel with the switch, the first inductance, and the second inductance, and
further comprising a second matching network connected at the first node point between the capacitance and the second inductance, wherein the second matching network comprises a third inductance connected in series and a third capacitance connected in parallel to the first capacitance and the third inductance, wherein the load is connected at a second node point of the third inductance and the third capacitance.

18. The system of claim 16, wherein the second capacitance is connected between the first node point and the second matching network.

19. The system of claim 15, wherein the power source comprises a controllable voltage source and wherein the voltage source is switched to the first node point through the choke.

20. The system of claim 15, wherein the power source comprises a controllable voltage source and wherein the voltage source is switched to the first node point through a band-eliminating filter that is tuned to the basic frequency.

21. The system of claim 13, wherein the power source comprises a current source.

22. The system of claim 13, wherein at least one of the parasitic oscillating circuits comprises interconnected reactive elements within the first circuit, the second circuit and the network, and wherein a resonance frequency of the at least one of the parasitic oscillating circuits is lower than the basic frequency.

23. The system of claim 15, wherein the first capacitance comprises a first partial capacitance and a second partial capacitance in series with each other and further comprising:

a resistance connected to ground in parallel with the two partial capacitances; and an inductance connected between the second partial capacitance and ground, wherein the series circuit of the second partial capacitance and the inductance is tuned to the basic frequency.

24. The system of claim 16, wherein the third inductance comprises a first partial inductance and a second partial inductance in series with each other, and further comprising a resistance connected between the two partial inductances at one end and to the first node point at the other end, and wherein the second capacitance and the first partial inductance form a series circuit tuned to the basic frequency.

25. The system of claim 7, wherein the switch comprises at least one MOSFET, which comprises a parasitic reverse diode having a voltage-dependent capacitance and a parasitic transistor, which reaches its conducting state during rapid voltage changes.

26. A method of generating a radio-frequency alternating voltage with an amplifier operating in a resonant mode, the method comprising:

switching on and off at least one switching element of the amplifier at a basic frequency to supply power from a uniform power source into a resonant circuit connected to a variable-resistance load, wherein the resonant circuit comprises several interconnected components, including reactive elements, which form, in their interconnected state during certain operating states of the amplifier, one or more parasitic oscillating circuits having undesired resonance frequencies other than the basic frequency;

identifying one or more of the parasitic oscillating circuits having resonance frequencies lower than the basic frequency that develop in different operating states of the amplifier that differ from a normal operating state of the amplifier, wherein the different operating states are due to at least one of a load resistance that differs from a normal load resistance, a supply voltage that differs from a normal supply voltage, or an output power that differs from a normal output power; and preventing oscillations in the identified one or more parasitic oscillating circuits from arising;

wherein the uniform power source is operated as a current source or as a voltage source with an internal resistance that is sufficiently high to achieve an approximately constant current output.

27. A method of generating a radio-frequency alternating voltage with an amplifier operating in a resonant mode, the method comprising:

switching on and off at least one switching element of the amplifier at a basic frequency to supply power from a uniform power source into a resonant circuit connected to a variable-resistance load, wherein the resonant circuit comprises several interconnected components, including reactive elements, which form, in their interconnected state during certain operating states of the amplifier, one or more parasitic oscillating circuits having undesired resonance frequencies other than the basic frequency;

identifying one or more of the parasitic oscillating circuits having resonance frequencies lower than the basic frequency that develop in different operating states of the amplifier that differ from a normal operating state of the amplifier, wherein the different operating states are due to at least one of a load resistance that differs from a normal load resistance, a supply voltage that differs from a normal supply voltage, or an output power that differs from a normal output power; and preventing oscillations in the identified one or more parasitic oscillating circuits from arising by attenuating the one or more identified parasitic oscillating circuits;

wherein the one or more parasitic oscillating circuit are attenuated by a circuit that comprises at least one non-linear element that extracts energy from the one or more parasitic oscillating circuits and reintroduces this energy at another location of the resonant circuit.

28. A radio-frequency power amplifier system, wherein the amplifier is operated in a resonant mode of operation, the amplifier comprising:

a uniformly controllable power source;

a switching element adapted for applying power on and off at a basic frequency from the uniform power source to a resonant circuit connected to a varying-resistance load at an output of the resonant circuit;

a plurality of interconnected electrical components, including reactive elements, that together form, in their interconnected state during a particular operating state of the amplifier, one or more parasitic oscillating circuits having undesired resonance frequencies lower than the basic frequency;

one or more attenuating members adapted for attenuating oscillations in the parasitic oscillating circuits to prevent oscillations in the parasitic oscillating circuits from arising and to suppress low-frequency modulations of the basic frequency;

a first circuit connected to the uniform power source, the first circuit comprising largely loss-free reactive elements adapted to ensure that power supplied to other parts of the amplifier remains constant over a basic frequency period;

a network connected to the first circuit, the network comprising non-dissipative reactive elements and being adapted for connection to the load; and a second circuit connected to the network, the second circuit comprising a switching element that is switched at the basic frequency that comprises largely non-dissipative reactive elements.

29. The system of claim 28, wherein the power source comprises a current source.

30. The system of claim 28, wherein at least one of the parasitic oscillating circuits comprises interconnected reactive elements within the first circuit, the second circuit and the network, and wherein a resonance frequency of the at least one of the parasitic oscillating circuits is lower than the basic frequency.

* * * * *